US012769414B2

(12) United States Patent
Chung et al.

(10) Patent No.: US 12,769,414 B2
(45) Date of Patent: Oct. 20, 2026

(54) DISPLAY DEVICE AND MANUFACTURING METHOD THEREOF

(71) Applicant: SAMSUNG DISPLAY CO., LTD., Yongin-si (KR)

(72) Inventors: Yung Bin Chung, Yongin-si (KR); Sang Wook Lee, Yongin-si (KR); In Seok Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/075,873

(22) Filed: Mar. 11, 2025

(65) Prior Publication Data

US 2025/0335049 A1 Oct. 30, 2025

(30) Foreign Application Priority Data

Apr. 24, 2024 (KR) ........................ 10-2024-0054608

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0443* (2019.05); *G06F 3/041* (2013.01); *G06F 3/04164* (2019.05); *G06F 3/0446* (2019.05); *G06F 2203/04103* (2013.01); *G06F 2203/04111* (2013.01); *G09G 2320/0223* (2013.01); *H01B 5/14* (2013.01); *H10K 59/1201* (2023.02); *H10K 59/131* (2023.02); *H10K 59/40* (2023.02); *H10K 71/60* (2023.02); *H10P 14/43* (2026.01)

(58) Field of Classification Search
CPC .... G06F 3/0412; G06F 3/0443; G06F 3/0446; G06F 2203/04103; G06F 2203/04111; G06F 2203/04112; G06F 3/04164; G06F 3/0445; G06F 3/041; H01B 3/18; H01B 5/14; H10K 59/1201; H10K 59/131; H10K 59/40; H10K 71/60; H10P 14/43; G09G 2320/0223
See application file for complete search history.

(56) References Cited

U.S. PATENT DOCUMENTS

| | | | |
|---|---|---|---|
| 9,239,654 | B2 | 1/2016 | Jang |
| 10,854,691 | B2 | 12/2020 | Kim et al. |

(Continued)

FOREIGN PATENT DOCUMENTS

| | | | |
|---|---|---|---|
| KR | 10-2367826 | B1 | 2/2022 |
| KR | 10-2023-0024479 | A | 2/2023 |

*Primary Examiner* — Douglas Wilson
(74) *Attorney, Agent, or Firm* — F. CHAU & ASSOCIATES, LLC

(57) ABSTRACT

A display device including a substrate. Pixels are disposed on the substrate. A base layer is disposed on the pixels. A first conductive pattern is disposed on the base layer. A touch insulating layer is disposed on the base layer. The touch insulating layer includes contact holes defined therein. The contact holes overlap portions of the first conductive pattern. Second conductive patterns are disposed on the touch insulating layer. Conductive films are disposed within the contact holes. A first portion of the second conductive patterns are disposed in the contact holes and are electrically connected to the first conductive pattern through the conductive films.

20 Claims, 11 Drawing Sheets

(51) Int. Cl.

| | |
|---|---|
| ***H10K 59/12*** | (2023.01) |
| ***H10K 59/131*** | (2023.01) |
| ***H10K 71/60*** | (2023.01) |
| ***H10P 14/43*** | (2026.01) |
| *H01B 5/14* | (2006.01) |
| *H10K 59/40* | (2023.01) |

(56) References Cited

U.S. PATENT DOCUMENTS

| | | | | |
|---|---|---|---|---|
| 11,720,194 | B2 | 8/2023 | Park et al. | |
| 2012/0228110 | A1* | 9/2012 | Takahashi | G06F 3/0445 174/250 |
| 2018/0204853 | A1* | 7/2018 | Saitoh | G02F 1/1343 |
| 2020/0401274 | A1* | 12/2020 | Moon | G06F 3/045 |
| 2021/0242284 | A1* | 8/2021 | Kim | G06F 3/0412 |
| 2023/0093856 | A1* | 3/2023 | Kim | G06F 3/0443 345/174 |

* cited by examiner

DISPLAY DEVICE AND MANUFACTURING METHOD THEREOF

CROSS-REFERENCE TO RELATED APPLICATION

This application claims priority under 35 U.S.C. § 119 to Korean Patent Application No. 10-2024-0054608, filed on Apr. 24, 2024 in the Korean Intellectual Property Office, the disclosure of which is incorporated by reference in its entirety herein.

1. Technical Field

The present disclosure relates to a display device and a manufacturing method thereof.

2. Discussion of Related Art

Consumer demand for display devices for displaying information, such as portable display devices, has increased along with the advancement of the information society. Research is being conducted concerning portable display devices due to the increased demand for using a portable information medium.

Display devices have been developed to include a touch sensor to receive a user's touch input in addition to an image display function. For example, touch panels are being widely used along with the spread of mobile electronic devices such as smartphones and tablet computers. As touch panels become widely used, research is being conducted to increase the accuracy of touch detection and the speed of response to touch.

For example, the touch panel's parasitic capacitor and high resistance may increase RC delay, making it difficult to detect signals and resulting in a low response speed to touch. Accordingly, research to reduce RC delay is continuing. For example, RC delay may be reduced by forming a thick touch insulating layer. However, in this case, as the thickness of the touch insulating layer increases, defect problems may occur due to the non-contact phenomenon of the conductive layer.

SUMMARY

Embodiments of the present disclosure provide a display device including a touch sensor with increased sensing sensitivity.

Embodiments of the present disclosure provide a manufacturing method of the above-described display device.

According to an embodiment of the present disclosure, a display device including a substrate. Pixels are disposed on the substrate. A base layer is disposed on the pixels. A first conductive pattern is disposed on the base layer. A touch insulating layer is disposed on the base layer. The touch insulating layer includes contact holes defined therein. The contact holes overlap portions of the first conductive pattern. Second conductive patterns are disposed on the touch insulating layer. Conductive films are disposed within the contact holes. A first portion of the second conductive patterns are disposed in the contact holes and are electrically connected to the first conductive pattern through the conductive films.

In an embodiment, the contact holes may penetrate the touch insulating layer between the first conductive pattern and a first-second conductive pattern of the second conductive patterns, and between the first conductive pattern and a second-second conductive pattern of the second conductive patterns.

In an embodiment, the conductive films may include a conductive material formed through chemical vapor deposition process.

In an embodiment, the first portion of the second conductive patterns may be spaced apart from the first conductive pattern and the touch insulating layer with the conductive films interposed therebetween.

In an embodiment, the conductive films may cover inner surfaces of the contact holes.

In an embodiment, each of the conductive films may directly contact a first conductive pattern of the first conductive patterns and a second conductive pattern of the second conductive patterns.

In an embodiment, each of the second conductive patterns may include a (2-1)-th conductive pattern disposed directly on the touch insulating layer; and a (2-2)-th conductive pattern disposed inside one of the contact holes and directly connected to the (2-1)-th conductive pattern, the (2-2)-th conductive pattern is the first portion of the second conductive patterns.

In an embodiment, the (2-2)-th conductive pattern may be surrounded by the conductive films except for a first surface directly connected to the (2-1)-th conductive pattern.

In an embodiment, the contact holes may have an aspect ratio greater than or equal to 1.

In an embodiment, the touch insulating layer may include an organic insulating material.

In an embodiment, a thin film encapsulation layer is disposed on the pixels, the thin film encapsulation layer including at least one organic film and at least one inorganic film.

In an embodiment, the base layer is disposed on the thin film encapsulation layer.

In an embodiment, the base layer comprises an uppermost layer of the thin film encapsulation layer.

According to an embodiment of the present disclosure, a manufacturing method of a display device, includes providing a substrate. Pixels are formed on the substrate. A base layer is provided on the pixels. A first conductive pattern is formed on the base layer. A touch insulating layer is formed and includes contact holes overlapping portions of the first conductive pattern on the base layer. The contact holes expose the portions of the first conductive pattern. Conductive films are formed within the contact holes and contact the exposed portions of the first conductive patterns. Second conductive patterns are formed on the touch insulating layer. A first portion of the second conductive patterns are disposed in the contact holes and are formed to be electrically connected to the first conductive pattern through the conductive films.

In an embodiment, the conductive films may include a conductive material formed through a chemical vapor deposition process.

In an embodiment, the conductive films may cover inner surfaces of the contact holes.

In an embodiment, each of the conductive films may be in direct contact with a first conductive pattern of the first conductive patterns and a second conductive pattern of the second conductive patterns.

The contact holes may have an aspect ratio greater than or equal to 1.

In an embodiment, a thin film encapsulation layer is formed on the pixels. The thin film encapsulation layer includes at least one organic film and at least one inorganic film.

In an embodiment, the base layer is disposed on the thin film encapsulation layer or is an uppermost layer of the thin film encapsulation layer.

According to the embodiments of the present disclosure, it is possible to provide a display device including a touch sensor with increased sensing sensitivity.

Effects of embodiments of the present disclosure are not limited by what is illustrated in the above, and more various effects are included in the present specification.

DETAILED DESCRIPTION OF EMBODIMENTS

Figure 1:
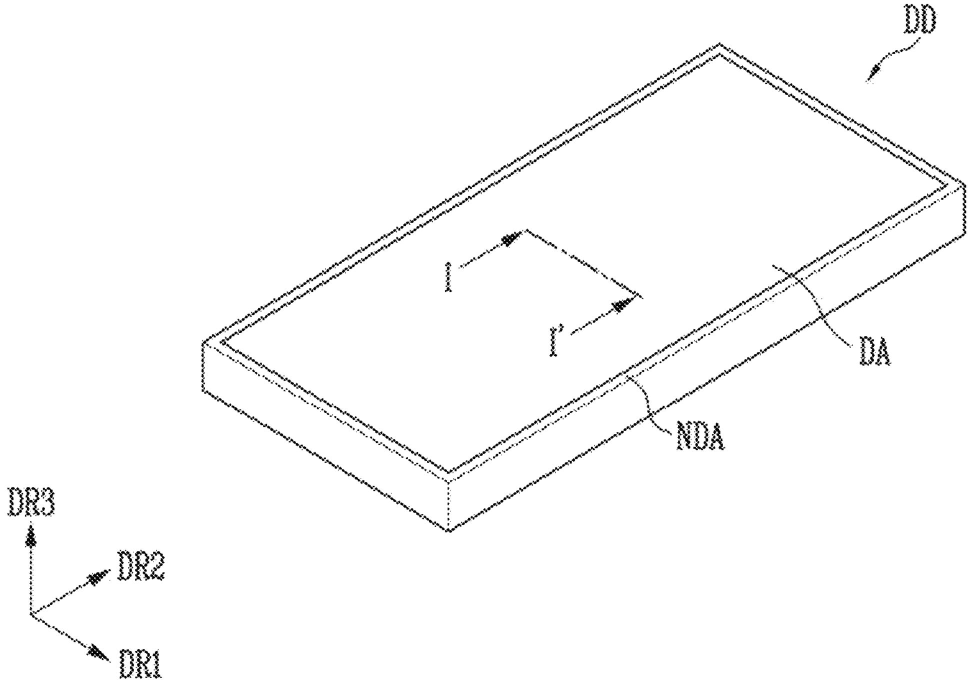
FIG. 1 illustrates a perspective view of a display device according to an embodiment of the present disclosure.

Hereinafter, embodiments of the present disclosure will be described in detail with reference to the accompanying drawings. The following description is intended to provide only a sufficient disclosure to enable the understanding of the operation of the invention, and other disclosure may be omitted to avoid obscuring the scope of the invention. In addition, the present disclosure may be embodied in different forms and is not limited to the described embodiments set forth herein.

Throughout the specification, when it is described that an element is “connected” to another element, this includes not only being “directly connected”, but also being “indirectly connected” with another device or element therebetween. When it is described that an element is “directly connected” to another element, no intervening elements may be disposed therebetween. The terms used herein are for the purpose of describing specific non-limiting embodiments and are not intended to limit the scope of embodiments of the present disclosure. Throughout the specification, unless explicitly described to the contrary, the word “comprise” and variations such as “comprises” or “comprising” will be understood to imply the inclusion of stated elements but not the exclusion of any other elements. For the purposes of this disclosure, “at least one of X, Y, and Z” and “at least one selected from the group consisting of X, Y, and Z” may be construed as X only, Y only, Z only, or any combination of two or more of X, Y, and Z, such as, for instance, XYZ, XYY, YZ, and ZZ. As used herein, the term “and/or” includes any and all combinations of one or more of the associated listed items.

Although the terms first, second, etc. may be used herein to describe various constituent elements, these constituent elements should not be limited by these terms. These terms are used to distinguish one constituent element from another. Thus, a first constituent element discussed below could be termed a second constituent element without departing from the teachings of the present disclosure.

Spatially relative terms, such as “beneath,” “below,” “lower,” “above,” “upper,” and the like, may be used herein for descriptive purposes, and, thereby, to describe one element or feature’s relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as “below” or “beneath” other elements or features would then be oriented “above” the other elements or features. Thus, the term “below” can encompass both an orientation of above and below. Furthermore, the apparatus may be otherwise oriented (for example, rotated 90 degrees or at other orientations), and, as such, the spatially relative descriptors used herein interpreted accordingly.

Various embodiments are described herein with reference to cross-sectional illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular illustrated shapes of regions, but are to include deviations in shapes that result from, for instance, manufacturing. Thus, the regions illustrated in the drawings may be schematic in nature and their shapes may not illustrate the actual shape of a region of a device. Therefore, embodiments of the present disclosure are not necessarily limited thereto.

FIG. 1 illustrates a perspective view of a display device according to an embodiment of the present disclosure.

Referring to FIG. 1, in an embodiment the display device DD is applied to an electronic device, such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable device. However, embodiments of the present disclosure are not necessarily limited thereto.

The display device DD may be provided in various shapes, and as an example, may be provided in a rectangular plate shape (e.g., in a plan view) having two pairs of sides parallel to each other. However, embodiments of the present disclosure are not necessarily limited thereto. For example, in an embodiment in which the display device DD has the rectangular plate shape, sides of one pair of the two pairs of sides may be provided to be longer than sides of the other pair thereof. In addition, in FIG. 1, the display device DD is shown as having angled corners made of straight lines. However, embodiments of the present disclosure are not necessarily limited thereto. For example, in an embodiment in which the display device DD has a shape of a rectangular plate, a corner at which one long side and one short side contact each other may have a round shape.

In an embodiment, for better understanding and ease of description, the display device DD may have a rectangular shape having a pair of long sides and a pair of short sides. In an embodiment, the extension direction of the long side may be indicated as a second direction DR2, the extension direction of the short side may be indicated as a first direction DR1, and the direction perpendicular to the extension directions of the long side and the short side may be indicated as a third direction DR3. The first to third directions DR1 to DR3 may refer to directions indicated by the first to third directions DR1 to DR3, respectively. However, embodiments of the present disclosure are not necessarily limited thereto and the first to third directions DR1 to DR3 may cross each other at various different directions.

In an embodiment, at least a portion of the display device DD may have flexibility, and the display device DD may be folded, bent, rolled or otherwise deformed at the portion having the flexibility.

The display device DD may include a display area DA for displaying an image and a non-display area NDA provided in at least one side of the display area DA. The non-display area NDA may be an area in which images are not displayed. However, embodiments of the present disclosure are not necessarily limited thereto. In some embodiments, a shape of the display area DA and a shape of the non-display area NDA may be correspondingly designed.

Figure 2:
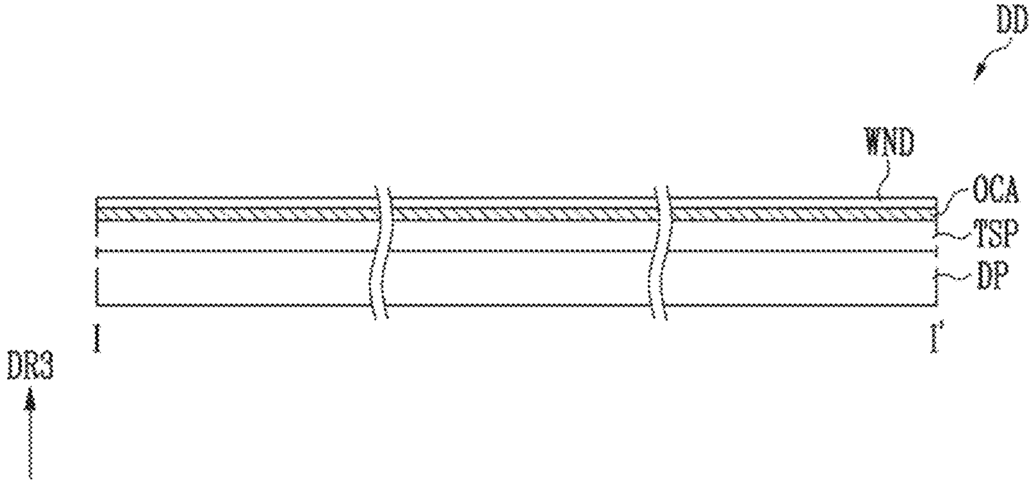
FIG. 2 illustrates a cross-sectional view taken along line I-I' of FIG. 1 according to an embodiment of the present disclosure.

FIG. 2 illustrates a cross-sectional view taken along line I-I' of FIG. 1.

Referring to FIG. 2, the display device DD may include a display panel DP, a sensing panel TSP (e.g., a touch sensor), and a window WND.

The display panel DP may display an image through the display area DA (see FIG. 1). In an embodiment, the display panel DP may be a self-emission display panel such as an organic light emitting display panel (OLED panel) using an organic light emitting diode as a light emitting element, a nano-scale LED display panel using an ultra small light emitting diode as a light emitting element, or a quantum dot organic light emitting display panel (QD OLED panel) using a quantum dot and an organic light emitting diode. In addition, in an embodiment the display panel DP may be a non-light emitting display panel such as a liquid crystal display panel (LCD panel), an electro-phoretic display panel (EPD panel), and an electro-wetting display panel (EWD panel). In an embodiment in which a non-light emitting display panel is used as the display panel DP, the display device DD may include a backlight unit that supplies light to the display panel DP.

The sensing panel TSP may be disposed on the display panel DP to receive a user's touch input (e.g., disposed directly thereon in the third direction DR3). In an embodiment, the sensing panel TSP may sense the touch input by using a mutual capacitance method, or may sense the touch input by using a self-capacitance method.

The window WND for protecting an exposed surface may be disposed on the display panel DP and the sensing panel TSP (e.g., in the third direction DR3). The window WND may protect the display panel DP and the sensing panel TSP from external impact, and may provide an input surface and/or a display surface to a user. In an embodiment, the window WND may be attached to the display panel DP and the sensing panel TSP by using an optically clear adhesive OCA disposed between the window WND and the sensing panel TSP (e.g., in the third direction DR3).

In an embodiment, the window WND may have a multi-layered structure selected from a glass substrate, a plastic film, and a plastic substrate. For example, the multi-layered structure may be formed through a continuous process or an adhesive process using an adhesive layer. The window WND may be entirely flexible or partially flexible.

Figure 3:
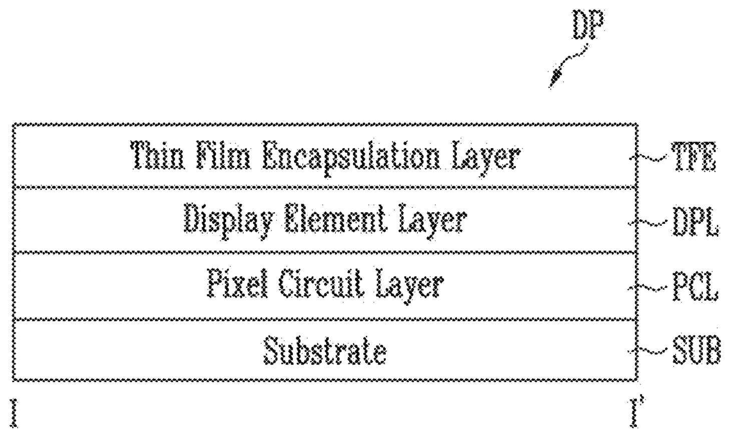
FIG. 3 illustrates a cross-sectional view of a display panel of FIG. 2 according to an embodiment of the present disclosure.

FIG. 3 illustrates a cross-sectional view of a display panel of FIG. 2 according to an embodiment.

Referring to FIG. 3, the display panel DP may include a substrate SUB, a pixel circuit layer PCL, a display element layer DPL, and a thin film encapsulation layer TFE (e.g., arranged in the third direction DR3).

The substrate SUB may be a rigid substrate or a flexible substrate. In an embodiment in which the substrate SUB is a rigid substrate, the substrate SUB may be one of a glass substrate, a quartz substrate, a glass ceramic substrate, and a crystalline glass substrate. In an embodiment in which the substrate SUB is a flexible substrate, the substrate SUB may be one of a film substrate including a polymer organic material and a plastic substrate. In addition, the substrate SUB may include a fiber glass reinforced plastic (FRP). However, embodiments of the present disclosure are not necessarily limited thereto.

The pixel circuit layer PCL may be disposed on the substrate SUB (e.g., disposed directly thereon in the third direction DR3). A plurality of thin film transistors and wires connected to the thin film transistors may be disposed in the pixel circuit layer PCL. For example, in an embodiment each thin film transistor may have a structure in which a semiconductor layer, a gate electrode, and a source/drain electrode are sequentially stacked (e.g., in the third direction DR3) with an insulating layer interposed therebetween. In an embodiment, the semiconductor layer may include an amorphous silicon, a poly silicon, a low temperature poly silicon, and an organic semiconductor. The gate electrode and the source/drain electrode may include one of aluminum (Al), copper (Cu), titanium (Ti), and molybdenum (Mo). However, embodiments of the present disclosure are not necessarily limited thereto. In addition, the pixel circuit layer PCL may include at least one or more insulating layers.

The display element layer DPL may be disposed on the pixel circuit layer PCL (e.g., disposed directly thereon in the third direction DR3). The display element layer DPL may include a light emitting element that emits light. In an embodiment, the light emitting element may be, for example, an organic light emitting diode. However, embodiments of the present disclosure are not necessarily limited thereto. In some embodiments, the light emitting element may be an inorganic light emitting element including an inorganic light emitting material or a light emitting element (e.g., a quantum dot display element) that emits light by changing a wavelength of light emitted by using a quantum dot.

The thin film encapsulation layer TFE may be disposed on the display element layer DPL (e.g., disposed directly thereon in the third direction DR3). The thin film encapsulation layer TFE may be an encapsulation substrate or a multi-layered encapsulation film. In an embodiment in which the thin film encapsulation layer TFE is in a form of the encapsulation film, the thin film encapsulation layer TFE may include an inorganic film and/or an organic film. For example, the thin film encapsulation layer TFE may have a structure in which an inorganic film, an organic film, and an inorganic film are sequentially stacked (e.g., in the third direction DR3). The thin film encapsulation layer TFE may prevent external air and moisture from penetrating into the display element layer DPL and the pixel circuit layer PCL.

Figure 4:
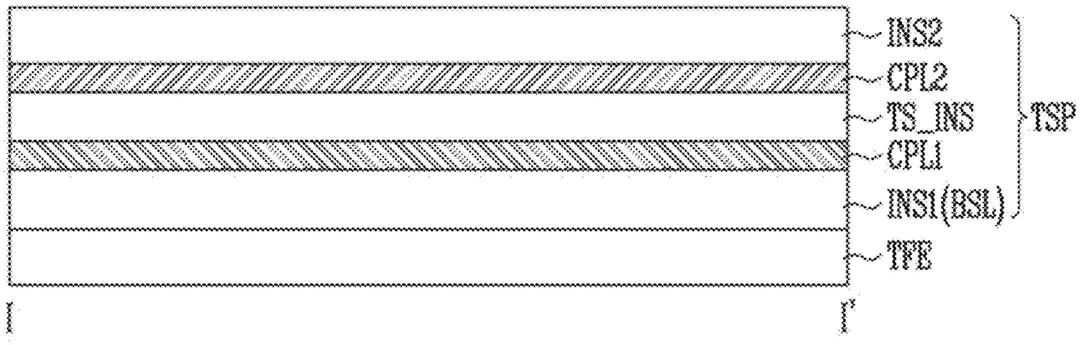
FIG. 4 illustrates a cross-sectional view of a sensing panel of FIG. 2 according to an embodiment of the present disclosure.

FIG. 4 illustrates a cross-sectional view of a sensing panel of FIG. 2 according to an embodiment.

Referring to FIG. 4, the sensing panel TSP (e.g., a touch sensor) may be directly disposed on a surface of the display panel DP (e.g., in third direction DR3) in which an image is displayed to receive a user's touch input and/or hover input. Here, "directly disposed" may mean formed through a continuous process, excluding attachment using a separate adhesive layer (e.g., a bonding layer).

In an embodiment, the sensing panel TSP may detect touch capacitance by contact and/or proximity of a user's hand or a separate input member such as a conductor similar to the user's hand to recognize a touch input and/or a hover input of the display device DD. Here, the touch input means directly touched (e.g., directly contacted) by the user's hand or the separate input member, and the hover input may mean that the user's hand or the separate input member is near the display device DD (e.g., in proximity thereto) including the sensing panel TSP but is not directly touching the sensing panel TSP.

In an embodiment, the sensing panel TSP may include a first insulating layer INS1, a first conductive layer CPL1, a touch insulating layer TS_INS, a second conductive layer CPL2, and a second insulating layer INS2 (e.g., consecutively arranged in the third direction DR3).

The first insulating layer INS1 may be a base layer BSL. In an embodiment, the first insulating layer INS1 is a predetermined insulating film, and may be disposed on the thin film encapsulation layer TFE. In an embodiment, the first insulating layer INS1 may be an uppermost layer of the thin film encapsulation layer TFE of the display panel DP. For example, the first insulating layer INS1 may be an insulating film that is an uppermost layer of the thin film encapsulation layer TFE (e.g., in the third direction DR3). However, embodiments of the present disclosure are not necessarily limited thereto. For example, in an embodiment, the first insulating layer INS1 may be an insulating film additionally disposed on the thin film encapsulation layer TFE.

The touch insulating layer TS_INS may be interposed between the first conductive layer CPL1 and the second conductive layer CPL2 (e.g., in the third direction DR3). In an embodiment, the touch insulating layer TS_INS may have a predetermined thickness for reducing RC delay. For example, in an embodiment the touch insulating layer TS_INS may have a thickness in a range of about 100 μm or less. However, embodiments of the present disclosure are not necessarily limited thereto.

The first conductive layer CPL1 may be disposed on the first insulating layer INS1 (e.g., disposed directly thereon in the third direction DR3). The second conductive layer CPL2 may be disposed on the first conductive layer CPL1 with the touch insulating layer TS_INS interposed therebetween (e.g., in the third direction DR3). The second insulating layer INS2 may be disposed on the second conductive layer CPL2 (e.g., disposed directly thereon in the third direction DR3).

In an embodiment, the first conductive layer CPL1 and/or the second conductive layer CPL2 may be implemented as a single layer. In this embodiment, the first conductive layer CPL1 and/or the second conductive layer CPL2 may include a metal layer or a transparent conductive layer. In an embodiment, the metal layer may include molybdenum, silver, titanium, copper, aluminum, and an alloy thereof. The transparent conductive layer may include a transparent conductive oxide such as an indium tin oxide (ITO), an indium zinc oxide (IZO), a zinc oxide (ZnO), and an indium tin zinc oxide (ITZO). In addition, the transparent conductive layer may include PEDOT, a metal nano wire, and graphene.

In an embodiment, the first conductive layer CPL1 and/or the second conductive layer CPL2 may be implemented as a multilayer. In this embodiment, the first conductive layer CPL1 and/or the second conductive layer CPL2 may include a multi-layered metal layer. According to an embodiment, the multi-layered metal layer may have a three-layered structure of titanium (Ti)/aluminum (Al)/titanium (Ti).

The touch insulating layer TS_INS and the second insulating layer INS2 may include an inorganic insulating material or an organic insulating material, respectively. According to an embodiment, the inorganic insulating material may include at least one of an aluminum oxide, a titanium oxide, a silicon oxide, a silicon nitride, a silicon oxynitride, a zirconium oxide, and a hafnium oxide. The organic insulating material may include at least one of an acrylic resin, a methacrylic resin, a polyisoprene resin, a vinyl resin, an epoxy resin, a urethane resin, a cellulose resin siloxane resin, a polyimide resin, a polyamide resin, and a perylene resin. According to an embodiment, the touch insulating layer TS_INS may be an organic insulating layer including an organic insulating material.

Figure 8:
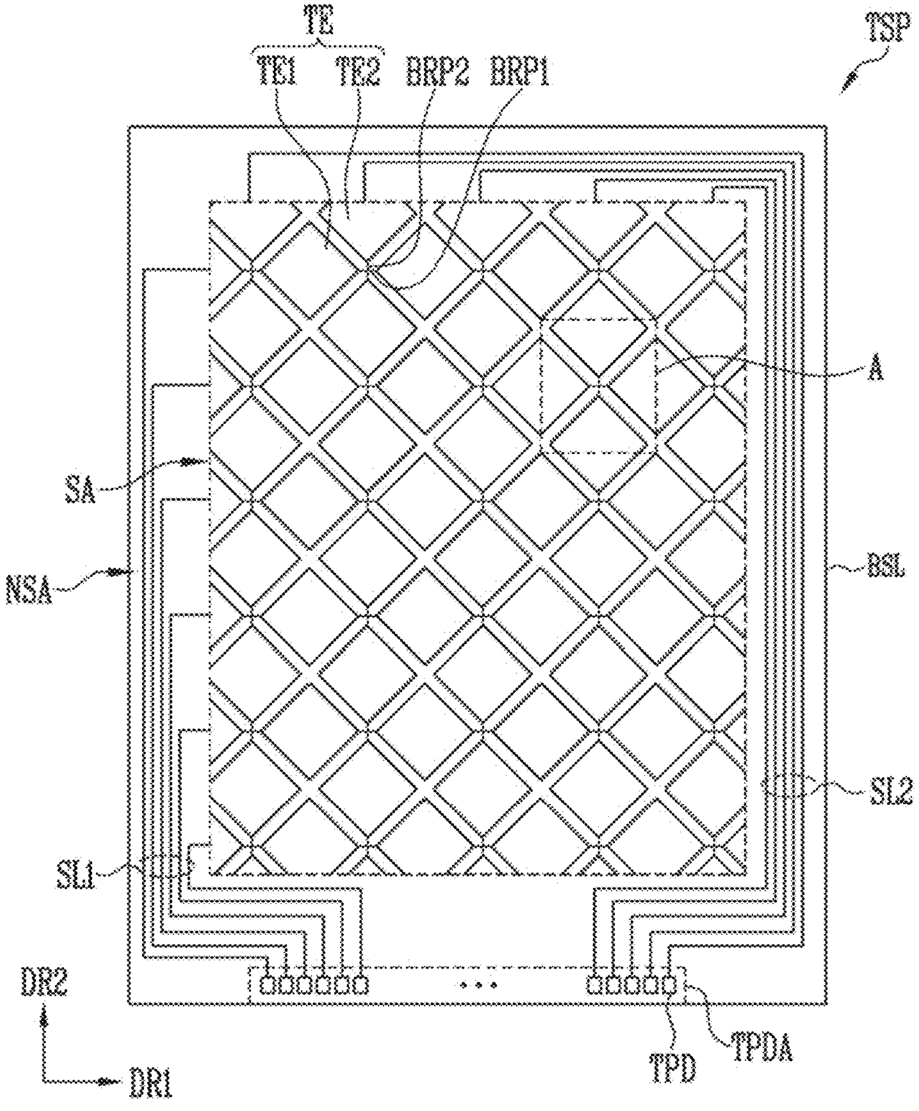
FIG. 8 illustrates a top plan view of a sensing panel of the display device of FIG. 1 according to an embodiment of the present disclosure.

According to an embodiment, the first conductive layer CPL1 and/or the second conductive layer CPL2 may include sensor electrodes (TE in FIG. 8), bridge patterns BRP1 and BRP2, and sensing wires (SL1 and SL2 in FIG. 8).

In an embodiment, the second insulating layer INS2 may be a passivation layer entirely disposed and/or formed on the second conductive layer CPL2 (e.g., directly thereon in the third direction DR3). The second insulating layer INS2 may prevent corrosion of the second conductive layer CPL2 by preventing the second conductive layer CPL2 from being exposed to the outside.

Figure 5:
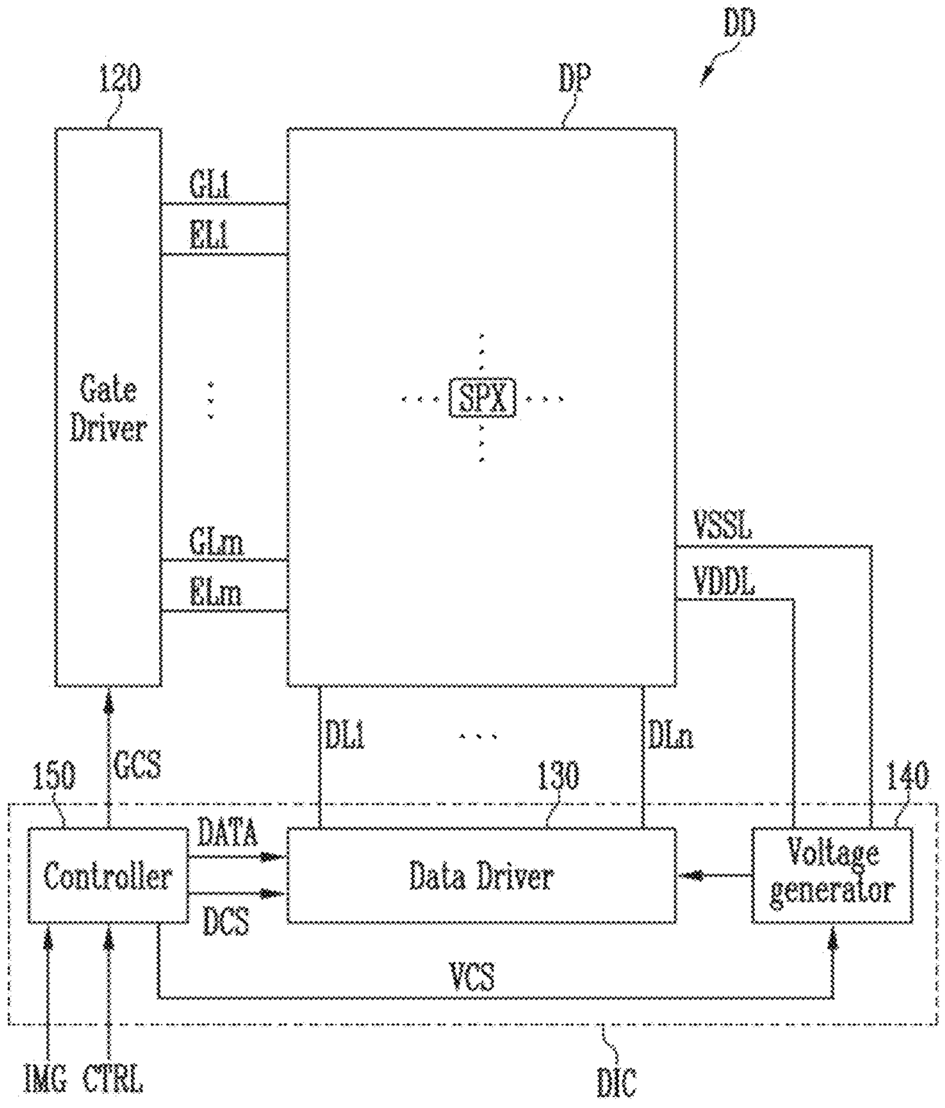
FIG. 5 illustrates a block diagram of the display device of FIG. 1 according to an embodiment of the present disclosure.

FIG. 5 illustrates a block diagram of the display device of FIG. 1 according to an embodiment.

Referring to FIG. 5, in an embodiment the display device DD may include the display panel DP, a gate driver 120, a data driver 130, a voltage generator 140, and a controller 150.

The display panel DP may includes a plurality of sub-pixels SPX. The sub-pixels SPX may be connected to the gate driver 120 through first to m-th gate lines GL1 to GLm. The sub-pixels SPX may be connected to the data driver 130 through first to n-th data lines DL1 to DLn.

Each of the sub-pixels SPX may include at least one light emitting element configured to generate light. Accordingly, the sub-pixels SPX may respectively generate light of a specific color, such as red, green, blue, cyan, magenta, yellow, or the like. However, embodiments of the present disclosure are not necessarily limited thereto and the colors generated by the sub-pixels SPX may vary.

The gate driver 120 may be connected to the sub-pixels SPX disposed in a row direction through the first to m-th gate lines GL1 to GLm. The gate driver 120 may output gate signals to the first to m-th gate lines GL1 to GLm in response to a gate control signal GCS. In an embodiment, the gate control signal GCS may include a start signal indicating the start of each frame, a horizontal synchronization signal for outputting gate signals in synchronization with the timing at which data signals are applied, and the like.

In some embodiments, the display device DD may further include first to m-th light emitting control lines EL1 to ELm connected to the sub-pixels SPX in a row direction. In this embodiment, the gate driver 120 may include a light emitting control driver configured to control the first to m-th light emitting control lines EL1 to ELm, and the light emitting control driver may operate under the control of the controller 150.

The data driver 130 may be connected to the sub-pixels SPX disposed in a column direction through the first to n-th data lines DL1 to DLn. The data driver 130 may receive image data (DATA) and a data control signal DCS from the controller 150. The data driver 130 may operate in response to the data control signal DCS. In an embodiment, the data control signal DCS may include a source start pulse, a source shift clock, a source output enable signal, and the like.

In an embodiment, the data driver 130 may use voltages from the voltage generator 140 to apply data signals having grayscale voltages corresponding to the image data (DATA) to the first to n-th data lines DL1 to DLn. When a gate signal is applied to each of the first to m-th gate lines GL1 to GLm, data signals corresponding to the image data DATA may be applied to the data lines DL1 to DLn. Accordingly, the corresponding sub-pixels SPX may generate light corresponding to the data signals. Consequently, an image may be displayed on the display panel DP.

In some embodiments, the gate driver 120 and the data driver 130 may include complementary metal-oxide semiconductor (CMOS) circuit elements.

The voltage generator 140 may operate in response to a voltage control signal VCS from the controller 150. In an embodiment, the voltage generator 140 may be configured to generate a plurality of voltages and provide the generated voltages to constituent elements of the display device DD. For example, the voltage generator 140 may be configured to generate a plurality of voltages by receiving an input voltage from the outside (e.g., an external device) of the display device DD, adjusting the received voltage, and regulating the adjusted voltage.

In an embodiment, the voltage generator 140 may generate a first power voltage and a second power voltage. The first and second power voltages may be provided to the sub-pixels SPX through first and second power lines VDDL and VSSL, respectively. The first power voltage may have a relatively high voltage level, and the second power voltage may have a voltage level lower than the first power voltage VDD. However, embodiments of the present disclosure are not necessarily limited thereto. For example, in some embodiments, the first power voltage or the second power voltage VSS may be provided by an external device of the display device DD.

In addition, the voltage generator 140 may generate various voltages. For example, in an embodiment the voltage generator 140 may generate an initialization voltage applied to the sub-pixels SPX. For example, during a sensing operation to sense electrical characteristics of transistors and/or light emitting elements of the sub-pixels SPX, a predetermined reference voltage may be applied to the first to n-first data lines DL1 to DLn, and the voltage generator 140 may generate the reference voltage.

The controller 150 may control various operations of the display device DD. The controller 150 may receive input image data IMG and a control signal CTRL for controlling the display of the input image data, from the outside (e.g., an external device). The controller 150 may provide the gate control signal GCS, the data control signal DCS, and the voltage control signal VCS in response to the control signal CTRL.

In an embodiment, the controller 150 may convert the input image data IMG to be suitable for the display device DD or the display panel DP to output the image data DATA. For example, in some embodiments the controller 150 may output the image data DATA by aligning the input image data IMG to be suitable for the sub-pixels SPX of a row unit.

Two or more components of the data driver 130, the voltage generator 140, and the controller 150 may be mounted on one integrated circuit. As shown in FIG. 5, in an embodiment the data driver 130, the voltage generator 140, and the controller 150 may be included in a driver integrated circuit DIC. In this embodiment, the data driver 130, the voltage generator 140, and the controller 150 may be functionally separate components within one driver integrated circuit DIC. However, embodiments of the present disclosure are not necessarily limited thereto. For example, in some embodiments, at least one of the data driver 130, the voltage generator 140, and the controller 150 may be provided as a component separated from the driver integrated circuit DIC.

Figure 6:
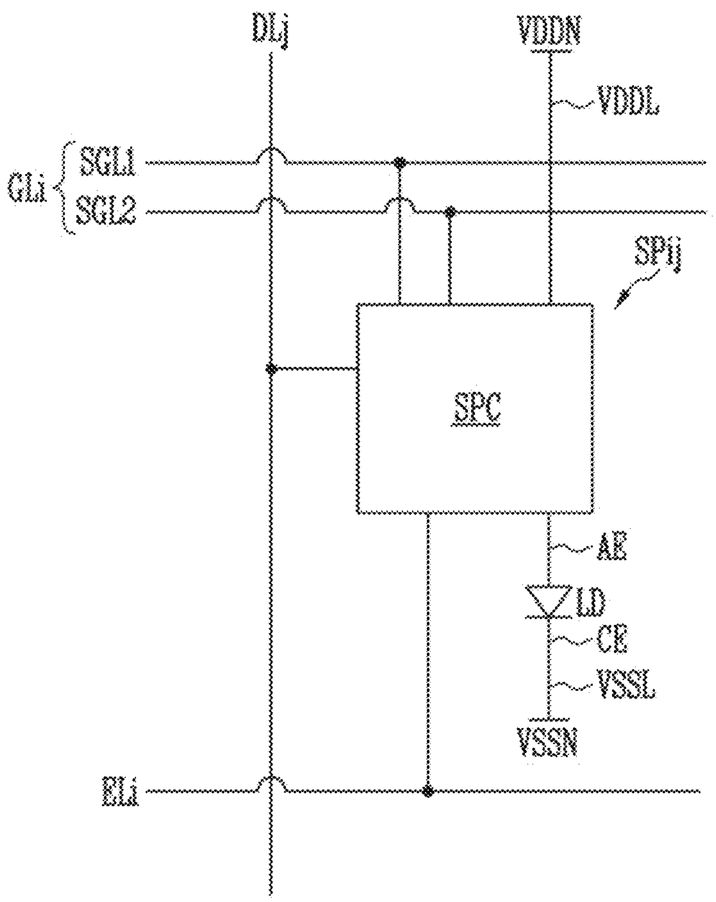
FIG. 6 illustrates a circuit diagram of a sub-pixel included in the display device of FIG. 1 according to an embodiment of the present disclosure.

FIG. 6 illustrates a circuit diagram of a sub-pixel included in the display device of FIG. 1 according to an embodiment.

In FIG. 6, among the sub-pixels SPX of FIG. 5, a sub-pixel SPXij disposed in an i-th row (i is an integer greater than or equal to 1 and less than or equal to m) and a j-th column (j is an integer greater than or equal to 1 and less than or equal to n) is illustrated as an example.

Referring to FIG. 6, the sub-pixel SPXij may include a sub-pixel circuit SPC and a light emitting element LD.

The light emitting element LD may be connected between a first power voltage node VDDN and a second power voltage node VSSN. The first power voltage node VDDN may be connected to the first power line VDDL to receive the first power voltage. The second power voltage node VSSN may be connected to the second power line VSSL to receive the second power voltage. The first power voltage may have a higher voltage level than the second power voltage.

The light emitting element LD may be connected between an anode electrode AE and a cathode electrode CE. The anode electrode AE may be connected to the first power voltage node VDDN through the sub-pixel circuit SPC. For example, the anode electrode AE may be connected to the first power voltage node VDDN through one or more transistors included in the sub-pixel circuit SPC. The cathode CE may be connected to the second power voltage node VSSN. The light emitting element LD may be configured to emit light according to a current flowing from the anode electrode AE to the cathode electrode CE.

The sub-pixel circuit SPC may be connected to an i-th gate line GLi of the first to m-th gate lines GL1 to GLm of FIG. 5 and a j-th data line DLj of the first to n-th data lines DL1 to DLn of FIG. 5. In response to the gate signal received through the i-th gate line GLi, the sub-pixel circuit SPC may control the light emitting element LD to emit light according to the data signal received through the j-th data line DLj. In an embodiment, the sub-pixel circuit SPC may be further connected to the pixel control lines of FIG. 5. In this embodiment, the sub-pixel circuit SPC may control the light emitting element LD in further response to pixel control signals received through the pixel control lines.

For these operations, the sub-pixel circuit SPC may include circuit elements, for example transistors and one or more capacitors.

The transistors of the sub-pixel circuit SPC may include P-type transistors and/or N-type transistors. In an embodiment, the transistors of the sub-pixel circuit SPC may include a metal oxide silicon field effect transistor (MOSFET). In an embodiment, the transistors of the sub-pixel circuit SPC may include an amorphous silicon semiconductor, a monocrystalline silicon semiconductor, a polycrystalline silicon semiconductor, and an oxide semiconductor.

Figure 7:
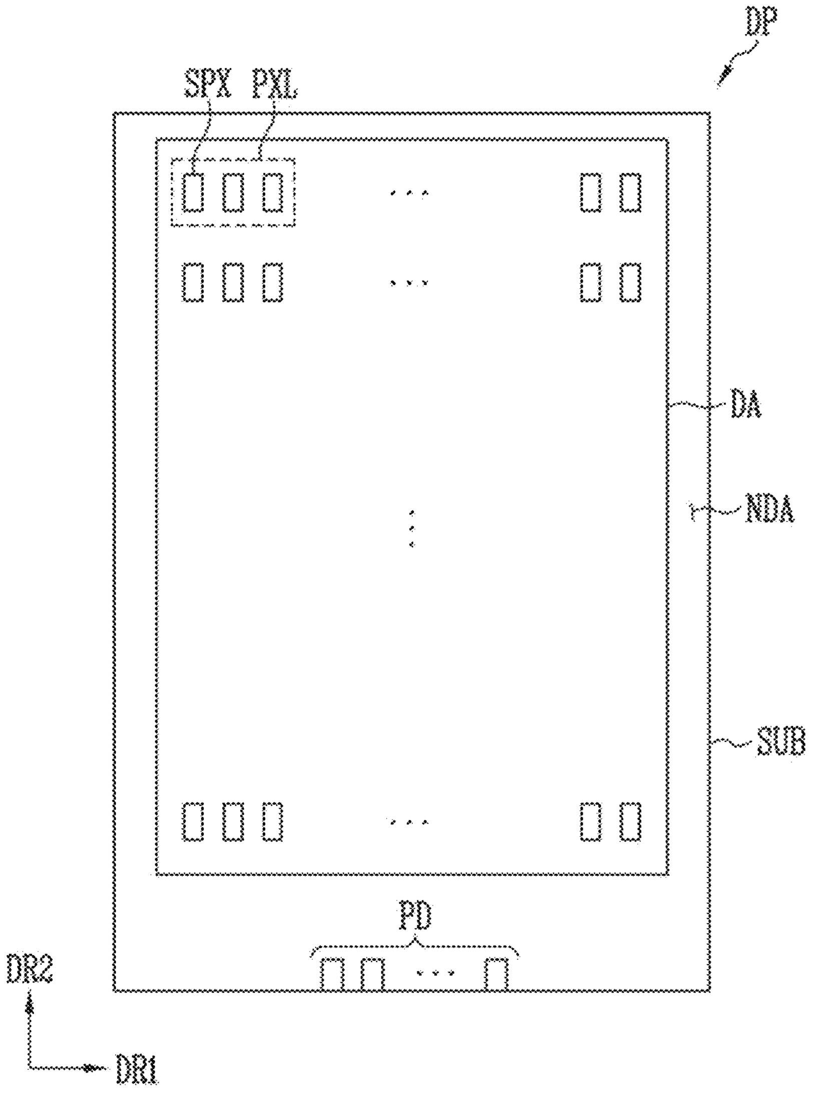
FIG. 7 illustrates a top plan view of a display panel of the display device of FIG. 1 according to an embodiment of the present disclosure.

FIG. 7 illustrates a top plan view of a display panel of the display device of FIG. 1 according to an embodiment.

Referring to FIG. 7, the display panel DP may include a display area DA and a non-display area NDA. The display panel DP may display an image through the display area DA. The non-display area NDA may be disposed around the display area DA (e.g., in the first and second directions DR1, DR2).

The display panel DP may include a substrate SUB, sub-pixels SPX, and pads PD.

The sub-pixels SPX may be disposed in the display area DA on the substrate SUB. In an embodiment, the sub-pixels SPX may be disposed in a matrix format along a first direction DR1 and a second direction DR2 that intersects the first direction DR1. However, embodiments of the present disclosure are not necessarily limited thereto. For example, in some embodiments the sub-pixels SPX may be disposed in a zigzag form along first direction DR1 and second direction DR2. For example, in an embodiment the sub-pixels SPX may be disposed in a PENTILE™ shape.

Two or more of the plurality of sub-pixels SPX may configure one pixel PXL. For example, three sub-pixels may configure one pixel PXL.

A constituent element to control the sub-pixels SPX may be disposed in the non-display area NDA on the substrate SUB. For example, wires connected to the sub-pixels SPX, such as the first to m-th gate lines GL1 to GLm and the first to n-th data lines DL1 to DLn of FIG. 5, may be disposed in the non-display area NDA.

In an embodiment, at least one of the gate driver 120, the data driver 130, the voltage generator 140, and the controller 150 in FIG. 5 may be integrated in the non-display area NDA of the display panel DP. In an embodiment, the gate driver 120 of FIG. 5 may be mounted on the display panel DP, and may be disposed in the non-display area NDA. However, embodiments of the present disclosure are not necessarily limited thereto. For example, in an embodiment, the gate driver 120 may be implemented as an integrated circuit separated from the display panel DP.

The pads PD may be disposed in the non-display area NDA on the substrate SUB. The pads PD may be electrically connected to the sub-pixels SPX through wires. For example, in an embodiment the pads PD may be connected to the sub-pixels SPX through the first to n-th data lines DL1 to DLn.

The pads PD may interface the display panel DP to other constituent elements of the display device DD (see FIG. 1). In an embodiment, voltages and signals required for operations of constituent elements included in the display panel DP may be provided from the driver integrated circuit DIC of FIG. 5 through the pads PD. For example, the first to n-th data lines DL1 to DLn may be connected to the driver integrated circuit DIC through the pads PD. For example, the first and second power voltages VDD and VSS may be received from the driver integrated circuit DIC through the pads PD. For example, in an embodiment in which the gate driver 120 is mounted on the display panel DP, the gate control signal GCS may be transmitted from the driver integrated circuit DIC to the gate driver 120 through the pads PD.

In an embodiment, the circuit board may be electrically connected to the pads PD by using a conductive adhesive member such as an anisotropic conductive film. In this embodiment, the circuit board may be a flexible printed circuit board (FPCB) or a flexible film made of a flexible material. The driver integrated circuit DIC may be mounted on the circuit board to be electrically connected to the pads PD.

In an embodiment, the display area DA may have various shapes (e.g., in a plan view). The display area DA may have a closed-loop shape including sides of a straight line and/or a curved line. For example, the display area DA may have shapes such as a polygonal shape, a circular shape, a semicircular, and an elliptical shape.

In an embodiment, the display panel DP may have a flat display surface. However, embodiments of the present disclosure are not necessarily limited thereto. For example, in an embodiment, the display panel DP may have a display surface that is at least partially three-dimensional, such as round, etc. In an embodiment, the display panel DP may be bendable, foldable, or rollable. In this embodiment, the display panel DP and/or the substrate SUB may include materials with flexible properties.

FIG. 8 illustrates a top plan view of a sensing panel of the display device of FIG. 1 according to an embodiment.

Referring to FIG. 8, the sensing panel TSP may include a base layer BSL including a sensor area SA (e.g., a sensing area or an active area) or a non-sensor area NSA (e.g., a non-sensing area). The base layer BSL may further include a pad area TPDA.

In an embodiment, the base layer BSL may include reinforced glass, transparent plastic, or transparent film. In some embodiments, the base layer BSL may include the same material as the substrate SUB of the display panel DP described above with reference to FIG. 3 and FIG. 7.

In an embodiment, the sensor area SA may be provided in the central area (e.g., in a plan view) of the base layer BSL to overlap the display area DA (see FIG. 1). In an embodiment, the sensor area SA may have substantially the same shape as the shape of the display area DA. However, embodiments of the present disclosure are not necessarily limited thereto. The sensor area SA may detect a touch input. Sensor electrodes for detecting the touch input may be provided and/or formed in the sensor area SA.

The non-sensor area NSA may be provided in a peripheral area of the base layer BSL to overlap the non-display area NDA (see FIG. 7). Here, the peripheral area may be an area surrounding the central area of the base layer BSL (e.g., in the first and second directions DR1, DR2). Sensing wires SL1 and SL2 electrically connected to the sensor electrodes TE to receive and transmit a sensing signal may be provided and/or formed in the non-sensor area NSA. In addition, a touch pad area TPDA connected to the sensing wires SL1 and SL2 to electrically connected to the sensor electrodes TE of the sensor area SA may be disposed in the non-sensor area NSA. The touch pad area TPDA may include touch pads TPD. The sensing wires SL1 and SL2 may include a plurality of first sensing wires SL1 and a plurality of second sensing wires SL2.

The sensor electrodes TE may include a plurality of first sensor electrodes TE1 and a plurality of second sensor electrodes TE2 electrically insulated from the first sensor electrodes TE1.

The first sensor electrodes TE1 and the second sensor electrodes TE2 may include a conductive material. In an embodiment, the conductive material may include at least one of a metal, an alloy of the metal, a conductive polymer, a conductive metal oxide, or a nano conductive material. However, embodiments of the present disclosure are not necessarily limited thereto.

The first sensor electrodes TE1 are arranged in the first direction DR1. The first sensor electrodes TE1 adjacent to each other may be electrically connected to each other through the first bridge pattern BRP1. The first sensor electrodes TE1 disposed in the row direction may configure one sensor row. The second sensor electrodes TE2 are arranged in the second direction DR2 intersecting the first direction DR1. The second sensor patterns TE2 adjacent to each other may be electrically connected to each other through the second bridge pattern BRP2. The second sensor electrodes TE2 disposed in the row direction may configure one sensor column.

The first and second sensor electrodes TE1 and TE2 may be electrically connected to the touch pads TPD through the corresponding sensing wires SL1 and SL2. The first sensor electrodes TE1 may be electrically connected to the touch pads TPD through the first sensing lines SL1. The second sensor electrodes TE2 may be electrically connected to the touch pads TPD through the second sensing lines SL2.

In an embodiment, the first sensor electrodes TE1 may be driving electrodes that receive a driving signal for detecting a touch position in the sensor area SA, and the second sensor electrodes TE2 may be sensing electrodes that output a sensing signal for detecting a touch position in the sensor area SA. However, embodiments of the present disclosure are not necessarily limited thereto. For example, in an embodiment the first sensor electrodes TE1 may be sensing electrodes, and the second sensor electrodes TE2 may be driving electrodes.

According to an embodiment, the sensing panel TSP may sense the touch input by using a mutual capacitance method, or may sense the touch input by using a self-capacitance method.

Figure 9:
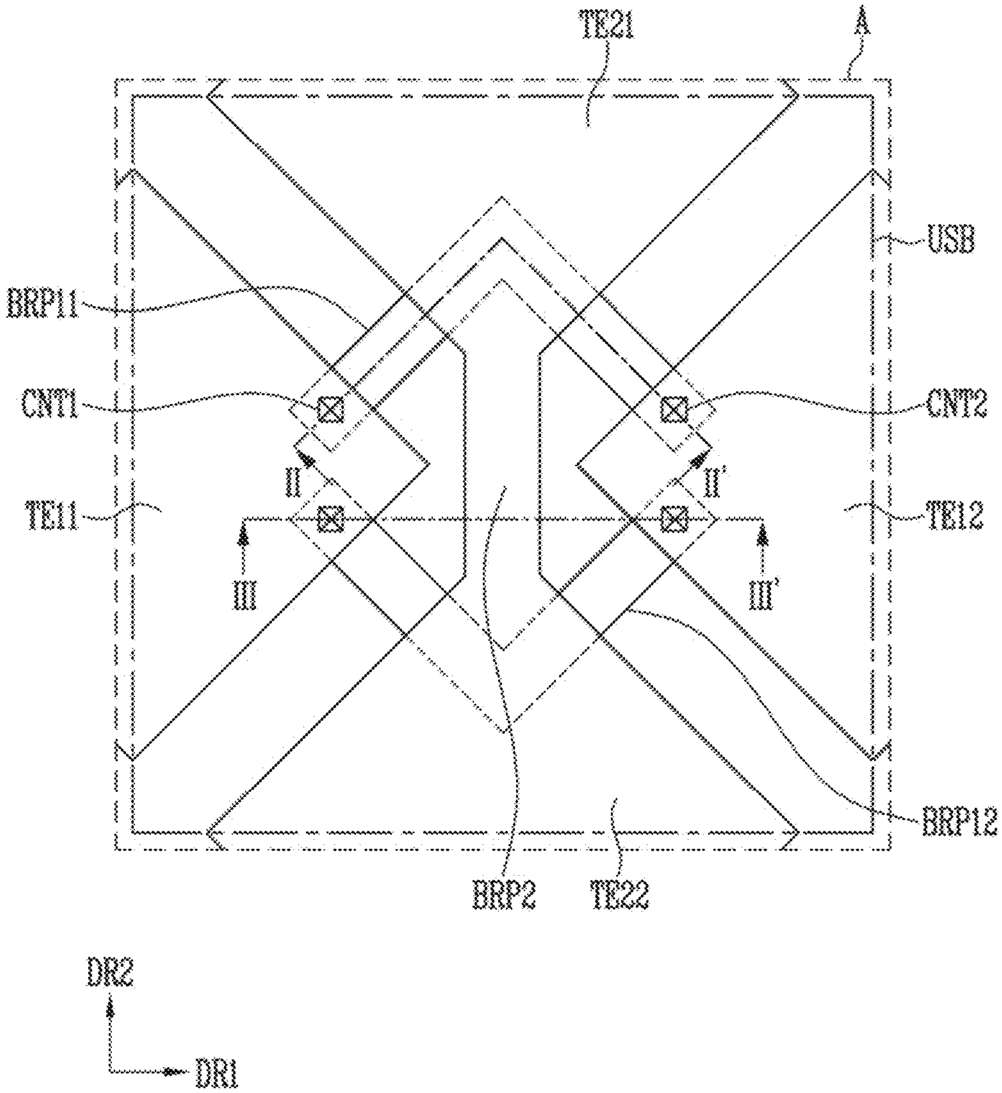
FIG. 9 illustrates an enlarged view of portion “A” of FIG. 8 according to an embodiment of the present disclosure.

FIG. 9 illustrates an enlarged view of portion “A” of FIG. 8 according to an embodiment.

Referring to FIG. 8 and FIG. 9, first bridge patterns BRP11 and BRP12 may electrically connect first sensor electrodes TE11 and TE12 adjacent to each other in the first direction DR1. The second bridge pattern BRP2 may electrically connect second sensor electrodes TE21 and TE22 adjacent to each other in the second direction DR2.

According to an embodiment, the first bridge patterns BRP11 and BRP12 may be disposed on different layers from those of the first sensor electrodes TE11 and TE12. In this embodiment, the first bridge patterns BRP11 and BRP12 may be connected to the first sensor electrodes TE11 and TE12 through first and second contact holes CNT1 and CNT2. On the other hand, in an embodiment the second bridge pattern BRP2 may be integrally formed with the second sensor electrodes TE21 and TE22. The first sensor electrodes TE11 and TE12, the second sensor electrodes TE21 and TE22, and the second bridge pattern BRP2 may be disposed on the same layer as each other.

The sensing panel TSP may have a structure in which unit sensor blocks USB are repeatedly disposed. The unit sensor block USB may mean a virtual unit block including a portion of the adjacent first sensor electrodes TE11 and TE12 and a portion of the adjacent second sensor electrodes TE21 and TE22. The unit sensor block USB may correspond to a minimum unit in which a disposition pattern of the first sensor electrodes TE1 and the second sensor electrodes TE2 is repeated.

Figure 10:
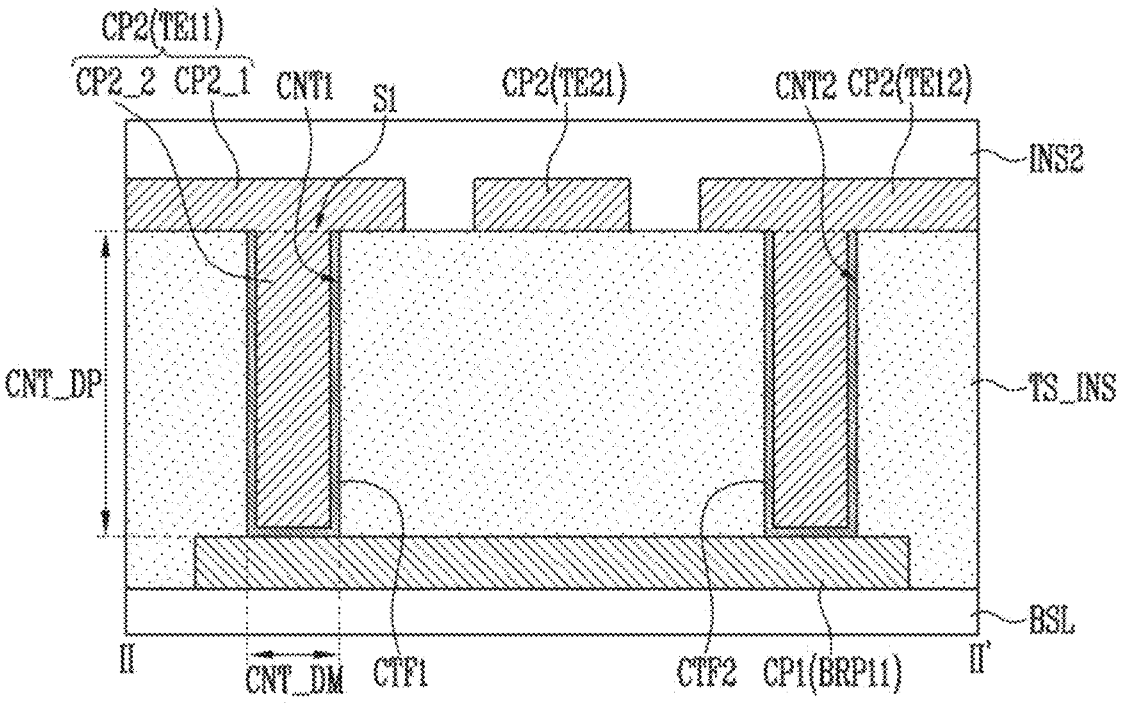
FIG. 10 illustrates a cross-sectional view taken along line II-II' of FIG. 9 according to an embodiment of the present disclosure.

FIG. 10 illustrates a cross-sectional view taken along line II-II' of FIG. 9.

Referring to FIG. 10, in an embodiment the base layer BSL may be disposed on the thin film encapsulation layer TFE (see FIG. 4). The base layer BSL may include an organic insulating film including an organic insulating material or an inorganic insulating film including an inorganic insulating material. In some embodiments, the base layer BSL may not be disposed on the thin film encapsulation layer TFE. For example, the thin film encapsulation layer TFE, such as the first insulating layer INS1, may be provided as the base layer BSL.

The first conductive pattern CP1 may be disposed on the base layer BSL (e.g., disposed directly thereon in the third direction DR3). In an embodiment, the first conductive pattern CP1 may include the first bridge patterns BRP11 and BRP12 described above with reference to FIG. 9. For example, the first conductive pattern CP1 shown in FIG. 10 may be provided as the first bridge pattern BRP11. The first conductive pattern CP1 may include a conductive material. For example, in an embodiment the conductive material may include a transparent conductive oxide or a metallic material. However, embodiments of the present disclosure are not necessarily limited thereto.

The touch insulating layer TS_INS may be disposed on (e.g., disposed directly thereon) the first conductive pattern CP1. The touch insulating layer TS_INS may be disposed on the base layer BSL (e.g., disposed directly thereon in the third direction DR3). For example, a first portion of the touch insulating layer TS_INS may directly contact an upper surface of the first bridge pattern BRP11 and be spaced apart from the base layer BSL with the first bridge pattern BRP11 interposed therebetween (e.g., in the third direction DR3). A second portion of the touch insulating layer TS_INS may be disposed to be in direct contact with the base layer BSL, such as an upper surface of the base layer BSL. In an embodiment, the touch insulating layer TS_INS may include substantially the same material as the base layer BSL. However, embodiments of the present disclosure are not necessarily limited thereto.

In an embodiment, the touch insulating layer TS_INS may have first and second contact holes CNT1 and CNT2 defined therein and overlapping portions of the first conductive pattern CP1. For example, the first contact hole CNT1 may penetrate the touch insulating layer TS_INS between the first bridge pattern BRP11 and one of the first sensor electrodes TE11 and may expose a portion of the first bridge pattern BRP11. The second contact hole CNT2 may penetrate the touch insulating layer TS_INS between the first bridge pattern BRP11 and the other one TE12 of the first sensor electrodes and may expose a portion of the first bridge pattern BRP11.

In an embodiment, the first and second contact holes CNT1 and CNT2 may have an aspect ratio greater than or equal to 1. In an embodiment, the depth CNT_DP of each of the first and second contact holes CNT1 and CNT2 may be in a range of about 50 μm to about 100 μm. However, if the first and second contact holes CNT1 and CNT2 have an aspect ratio greater than or equal to 1, the first and second contact holes CNT1 and CNT2 are not necessarily limited to the corresponding depth. For example, the first and second contact holes CNT1 and CNT2 may have different diameters CNT_DM depending on differences in composition of the touch insulating layer TS_INS. Accordingly, the depth CNT_DP of the first and second contact holes CNT1 and CNT2 may also vary. For example, in an embodiment in which the diameter CNT_DM of the first and second contact holes CNT1 and CNT2 is about 100 μm, the depth CNT_DP of the contact holes CNT1 and CNT2 may be greater than or equal to about 100 μm. In this embodiment, the aspect ratio of the first and second contact holes CNT1 and CNT2 may be greater than or equal to 1.

In an embodiment, the first and second contact holes CNT1 and CNT2 may include first and second conductive films CTF1 and CTF2 disposed in the first and second contact holes CNT1 and CNT2, respectively. For example, the first contact hole CNT1 may include a first conductive film CTF1 covering inner surfaces of the first contact hole CNT1. The second contact hole CNT2 may include a second conductive film CTF2 covering inner surfaces of the second contact hole CNT2. The first and second conductive films CTF1 and CTF2 may be in direct contact with the first conductive pattern CP1 and the second conductive patterns CP2. For example, in an embodiment lower surfaces of the first and second conductive films CTF1 and CTF2 may directly contact an upper surface of the first conductive pattern CP1 and upper surfaces of the first and second conductive films CTF1 and CTF2 may directly contact a lower surface of the second conductive patterns CP2. The first conductive film CTF1 may be disposed in the first contact hole CNT1 and may extend in a horizontal direction and/or a vertical direction along an inner surface of the first contact hole CNT1 to be in direct contact with the first conductive pattern. The first conductive film CTF1 may be in direct contact with the conductive pattern, which functions as the first sensor electrode TE11 among the second conductive patterns CP2, and the first conductive pattern CP1. The second conductive film CTF2 may be disposed in the second contact hole CNT2 and may extend in a horizontal direction and/or a vertical direction along an inner surface of the second contact hole CNT2 to be in direct contact with the first conductive pattern CP1. The second conductive film CTF2 may be in direct contact with the conductive pattern, which functions as the first sensor electrode TE12 among the second conductive patterns CP2, and the first conductive pattern CP1. The first and second conductive films CTF1 and CTF2 may be provided to reduce contact defects between the first conductive pattern CP1 and the second conductive patterns CP2 electrically connected through the first and second contact holes CNT1 and CNT2.

In an embodiment, the first and second conductive films CTF1 and CTF2 may include a conductive material formed through a chemical vapor deposition (CVD) process. For example, in an embodiment the first and second conductive films CTF1 and CTF2 doped with n-type or p-type may be formed by mixing a gas containing an dopant element such as monophosphane (PH3) or diboran (B2H6) with a conductive material. In an embodiment, the first and second conductive films CTF1 and CTF2 formed as described above may include a titanium silicon nitride (TiSiN), a tantalum silicon nitride (TaSiN), a tungsten silicon nitride (WSiN), and the like. However, embodiments of the present disclosure are not necessarily limited thereto.

In an embodiment, the first and second conductive films CTF1 and CTF2 may be deposited by chemical vapor deposition having better step coverage than physical vapor deposition. Here, the chemical vapor deposition may be a process of forming a thin film by coating particles generated by chemically reacting various reaction gases on the wafer surface. For example, in an embodiment the first and second conductive films CTF1 and CTF2 may be deposited by one of thermal chemical vapor deposition (thermal CVD), low-pressure chemical vapor deposition (LPCVD), plasma chemical vapor deposition (PECVD), atomic layer chemical vapor deposition (APCVD) (or atomic layer deposition (ALD)), metal organic chemical vapor deposition (MOCVD), and laser enhancement (LECVD).

As described above, the first and second conductive films CTF1 and CTF2 formed through the chemical vapor deposition may have a high step coverage. Due to the high step coverage, as the deposition of the first and second conductive films CTF1 and CTF2 progresses, an overhang phenomenon occurring in the first and second contact holes CNT1 and CNT2 may be prevented. Accordingly, the second conductive patterns CP2 disposed above the first and second contact holes CNT1 and CNT2 and the first conductive pattern CP1 disposed below the first and second contact holes CNT1 and CNT2 may be more stably electrically connected through the first and second conductive films CTF1 and CTF2.

The second conductive patterns CP2 may be disposed on the touch insulating layer TS_INS. For example, the second conductive patterns CP2 may be disposed directly on an upper surface of the touch insulating layer TS_INS and may extend in the first and second contact holes CNT1, CNT2. In an embodiment, the second conductive patterns CP2 may include the first sensor electrodes TE11 and TE12, the second sensor electrodes TE21 and TE22, and the second bridge pattern BRP2 described above with reference to FIG. 9. For example, the second conductive patterns CP2 shown in FIG. 10 may be provided as the first sensor electrodes TE11 and TE12 and the second sensor electrode TE21.

Among the second conductive patterns CP2, the conductive patterns functioning as the first sensor electrodes TE11 and TE12 may be electrically connected to the first conductive pattern CP1 through the first and second contact holes CNT1 and CNT2 of the touch insulating layer TS_INS. The second conductive patterns CP2 may include a conductive material. In an embodiment, the conductive material may include a transparent conductive oxide or a metallic material. However, embodiments of the present disclosure are not necessarily limited thereto.

For example, in an embodiment one of the first sensor electrodes TE11 (e.g., a first-second conductive pattern) may be electrically connected to the first bridge pattern BRP11 through the first conductive film CTF1 of the first contact hole CNT1. The other one of the first sensor electrodes TE12 (e.g., a second-second conductive pattern) may be electrically connected to the first bridge pattern BRP11 through the second conductive film CTF2 of the second contact hole CNT2.

According to an embodiment, each of the second conductive patterns CP2 may include a (2-1)-th conductive pattern CP2_1 disposed on the touch insulating layer TS_INS, such as an upper surface of the touch insulating layer TS_INS, and a (2-2)-th conductive pattern CP2_2 disposed inside one of the first and second contact holes CNT1 and CNT2. The (2-1)-th conductive pattern CP2_1 and the (2-2)-th conductive pattern CP2_2 may be provided as one connected (e.g., integral) conductive pattern. For example, the (2-2)-th conductive pattern CP2_2 that is a portion of the second conductive patterns CP2 may be disposed inside the first contact hole CNT1 and may be surrounded by the first conductive film CTF1. The (2-2)-th conductive pattern CP2_2 may be surrounded by the first conductive film CFT1, except for one surface S1 (e.g., a first surface) connected to the (2-1)-th conductive pattern CP2_1, such as a top surface of the (2-2)-th conductive pattern CP2_2. For example, in an embodiment the inner side surfaces of the first conductive film CTF1 may contact the entirety of the bottom surface and side surfaces of the (2-2)-th conductive pattern CP2_2. At the lower portion of the first contact hole CNT1, the (2-2)-th conductive pattern CP2_2 may be spaced apart from the first conductive pattern CP1 with the first conductive film CTF1 interposed therebetween (e.g., in the third direction DR3). At the side surface portion of the first contact hole CNT1, the (2-2)-th conductive pattern CP2_2 may be spaced apart from the touch insulating layer TS_INS with the first conductive film CTF1 interposed therebetween.

The second insulating film INS2 may be disposed on (e.g., disposed directly thereon) the touch insulating layer TS_INS and the second conductive patterns CP2. The second insulating film INS2 may protect the second conductive patterns CP2 from the external environment. The second insulating film INS2 may provide a flat top surface.

In the above-described embodiments, it has been described as an example that the first bridge pattern BRP11 is included in the first conductive pattern CP1, and the first sensor electrodes TE11 and TE12 and the second sensor electrode TE21 are included in the second conductive patterns CP2. However, embodiments of the present disclosure are not necessarily limited thereto. In some embodiments, the first sensor electrodes TE11 and TE12 and the second sensor electrode TE21 may be included in the first conductive pattern CP1, and the first bridge pattern BRP11 may be included in the second conductive patterns CP2.

As described above, the first and second conductive films CTF1 and CTF2 including a conductive material having high step coverage and low conductivity may be formed through chemical vapor deposition in the first and second contact holes CNT1 and CNT2 of the touch insulating layer TS_INS. Accordingly, the second conductive patterns CP2 functioning as the first sensor electrodes TE11 and TE12 may be stably connected to the first conductive pattern CP1 through the first and second conductive films CTF1 and CTF2 of the first and second contact holes CNT1 and CNT2.

Figure 11:
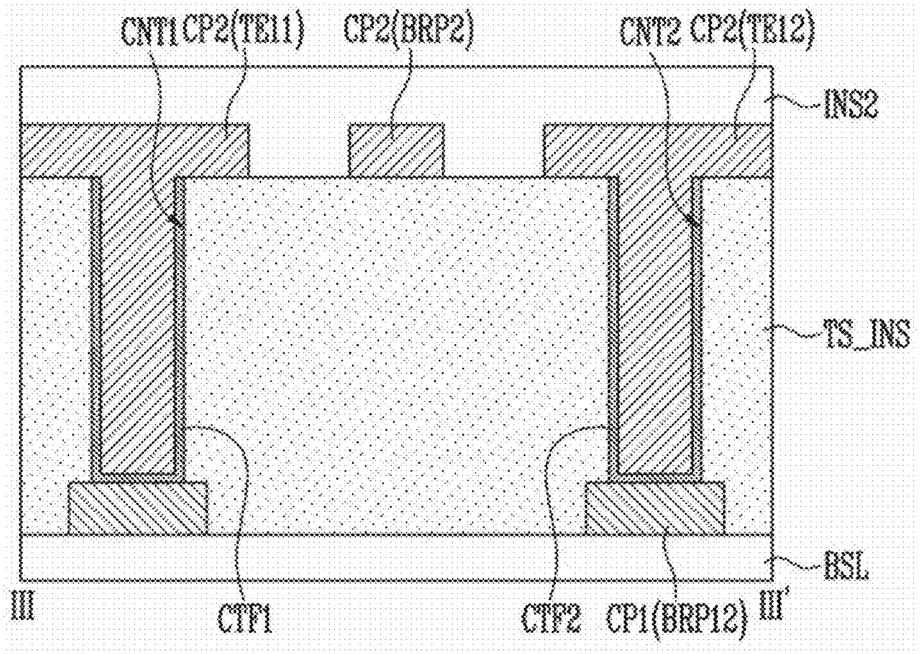
FIG. 11 illustrates a cross-sectional view taken along line III-III' of FIG. 9 according to an embodiment of the present disclosure.

FIG. 11 illustrates a cross-sectional view taken along line III-III' of FIG. 9.

Referring to FIG. 9 and FIG. 11, the second conductive patterns CP2 including the first sensor electrodes TE11 and TE12 and the second bridge pattern BRP2 adjacent to each other may be disposed on the touch insulating layer TS_INS. The first sensor electrodes TE11 and TE12 may be spaced apart from each other with the second bridge pattern BRP2 interposed therebetween. In an embodiment, the second bridge pattern BRP2 may be a conductive pattern integrally provided with the second sensor electrodes TE21 and TE22 adjacent to each other. According to an embodiment shown in FIG. 11, the first and second contact holes CNT1 and CNT2 may include the first and second conductive films CTF1 and CTF2 disposed respectively therein. The first contact hole CNT1 may penetrate the touch insulating layer TS_INS between one TE11 of the first sensor electrodes and the first bridge pattern BRP12. The first contact hole CNT1 may overlap the first bridge pattern BRP12 overlapping one TE11 of the first sensor electrodes. The second contact hole CNT2 may penetrate the touch insulating layer TS_INS between the other one of the first sensor electrodes TE11 and the first bridge pattern BRP12. The second contact hole CNT2 may overlap the first bridge pattern BRP12 overlapping the other one TE12 of the first sensor electrodes. The first and second contact holes CNT1 and CNT2 and the first and second conductive films CTF1 and CTF2 may be configured similarly to FIG. 10.

FIG. 12 to FIG. 16 are drawings for explaining a manufacturing method of the display device according to embodiments of the present disclosure.

Hereinafter, a manufacturing method of a display device including the sensing panel TSP (e.g., the touch sensor) described with reference to FIG. 8, FIG. 9, FIG. 10, and FIG. 11 will be described with reference to FIG. 12 to FIG. 16. In describing FIG. 12 to FIG. 16, descriptions of contents overlapping the contents described with reference to FIG. 8, FIG. 9, FIG. 10, and FIG. 11 may be omitted for economy of explanation.

Before forming the base layer BSL, as shown in FIG. 3, the substrate SUB may be provided, and the pixel circuit layer PCL and the display element layer DPL may be formed on one surface (e.g., an upper surface) of the substrate SUB to form the pixels PXL. Thereafter, the thin film encapsulation layer TFE may be formed on one surface on which the pixels PXL are formed.

Figure 12:
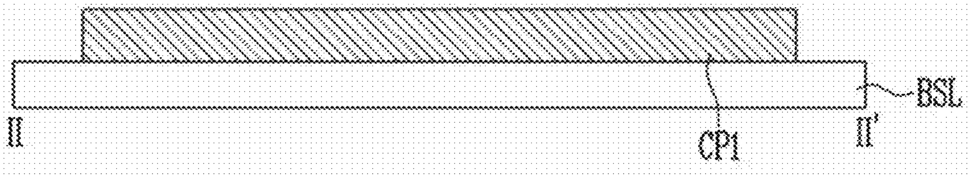
FIG. 12 to FIG. 16 are drawings for explaining a manufacturing method of the display device according to embodiments of the present disclosure.

Referring to FIG. 9 and FIG. 12, after the pixels PXL are formed, the base layer BSL may be formed on (e.g., formed directly thereon in the third direction DR3) the thin film encapsulation layer TFE (see FIG. 4). However, embodiments of the present disclosure are not necessarily limited thereto. For example, in an embodiment the base layer BSL may be the thin film encapsulation layer TFE, such as an uppermost layer of the thin film encapsulation layer TFE.

Thereafter, the first conductive pattern CP1 may be formed on the base layer BSL (e.g., formed directly thereon in the third direction DR3). For example, in an embodiment the first conductive pattern CP1 may have a single-layered structure including a metal layer or a transparent conductive layer. However, the first conductive pattern CP1 is not necessarily limited to a single-layered structure. For example, in an embodiment the first conductive pattern CP1 may have a three-layered structure in which titanium (Ti)/aluminum (Al)/titanium (Ti) are sequentially stacked.

Figure 13:
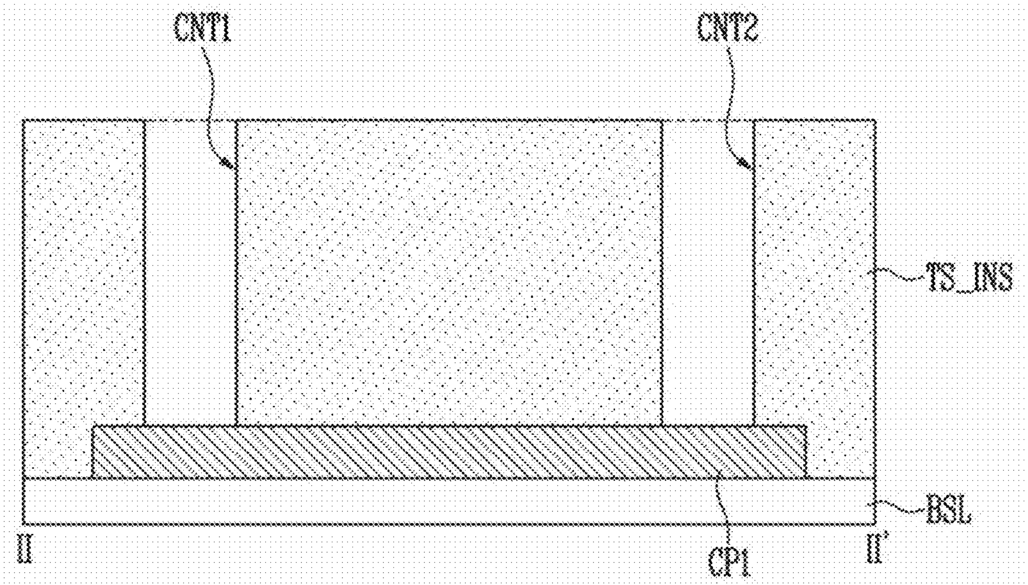

Referring to FIG. 9 and FIG. 13, the touch insulating layer TS_INS may be formed on the base layer BSL (e.g., formed directly thereon in the third direction DR3). Subsequently, the first and second contact holes CNT1 and CNT2 penetrating the touch insulating layer TS_INS may be formed. The first and second contact holes CNT1 and CNT2 may expose portions of the first conductive pattern CP1, such as portions of an uppermost surface of the first conductive pattern CP1.

For example, in an embodiment the touch insulating layer TS_INS may form the first and second contact holes CNT1 and CNT2 through a photolithography process to expose portions of the first conductive pattern CP1. For example, by forming a photoresist film on the touch insulating layer TS_INS and then performing exposure and development processes through a mask, the photoresist film may be patterned to form photoresist patterns with regular intervals. Areas removed from the photoresist film may be areas in which the first and second contact holes CNT1 and CNT2 are formed. Portions of the touch insulating layer TS_INS that do not overlap the photoresist patterns may be removed through an etching process to form the first and second contact holes CNT1 and CNT2 exposing portions of the first conductive pattern CP1. In an embodiment, the first and second contact holes CNT1 and CNT2 may be formed by etching the touch insulating layer TS_INS exposed by the photoresist patterns until portions of the first conductive pattern CP1 are exposed. After the first and second contact holes CNT1 and CNT2 are formed, photoresist patterns remaining on the touch insulating layer TS_INS may be removed.

Figure 14:
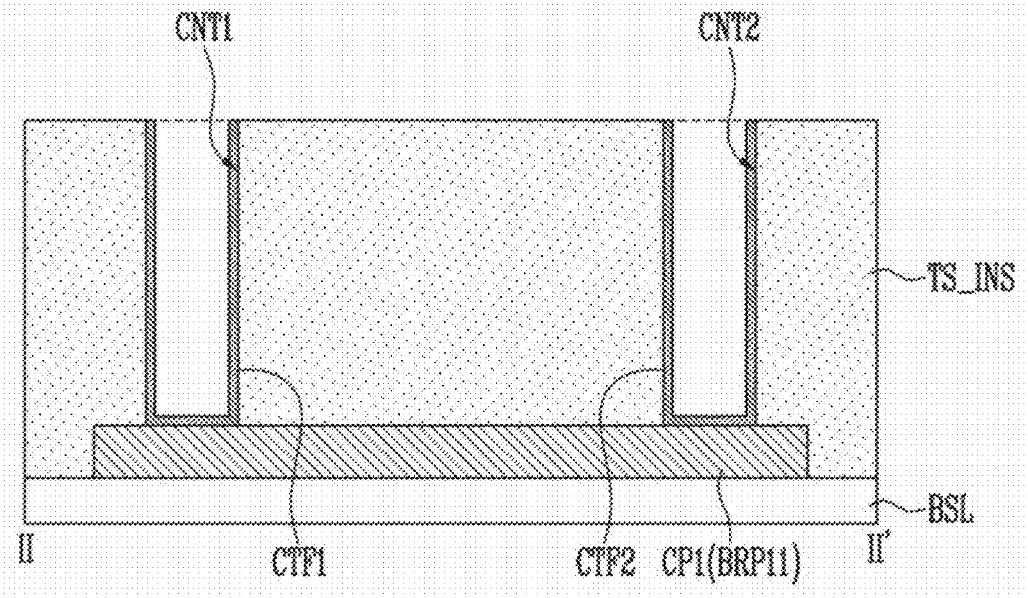

Referring to FIG. 9 and FIG. 14, the first and second conductive films CTF1 and CTF2 may be formed in the first and second contact holes CNT1 and CNT2, respectively. In an embodiment, the first and second conductive films CTF1 and CTF2 may be formed through chemical vapor deposition in the first and second contact holes CNT1 and CNT2. Through chemical vapor deposition, the deposition thickness of the first and second conductive films CTF1 and CTF2 is formed relatively uniformly, so that high step coverage may be provided even with the single-layered first and second conductive films CTF1 and CTF2. In an embodiment, the first conductive film CTF1 may be deposited to completely cover the inner surfaces of the first contact hole CNT1 through chemical vapor deposition (CVD). The second conductive film CTF2 may be deposited to completely cover the inner surfaces of the second contact hole CNT2 through chemical vapor deposition (CVD). The first and second conductive films CTF1 and CTF2 may be thin films including a conductive material.

Figure 15:
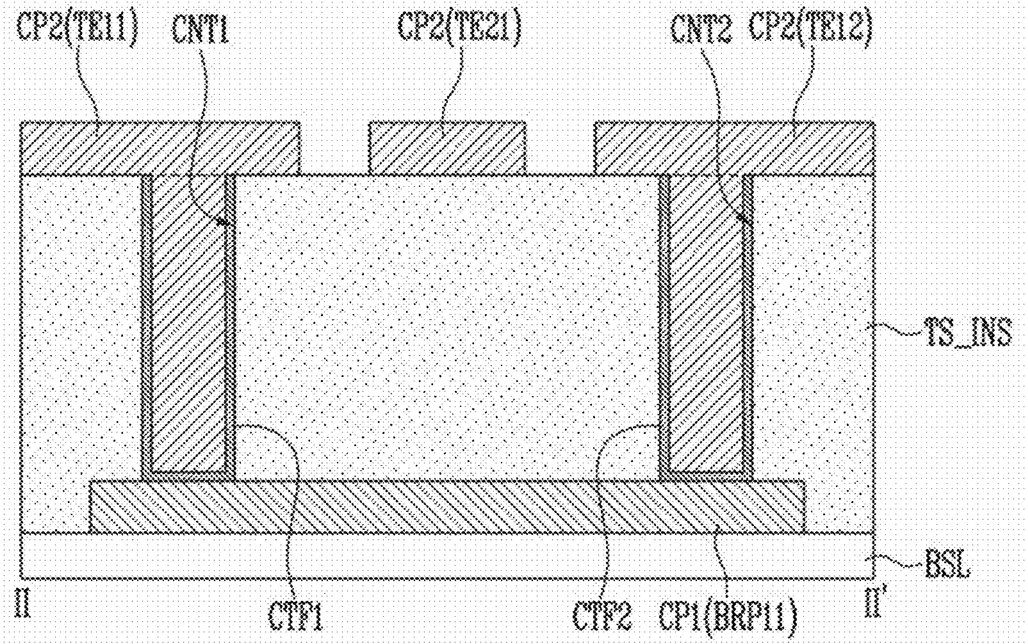

Referring to FIG. 9 and FIG. 15, the second conductive patterns CP2 may be formed on the touch insulating layer TS_INS. Portions of the second conductive patterns CP2, which overlap the first and second contact holes CNT1 and CNT2, may be disposed in the first and second contact holes CNT1 and CNT2 to be in direct contact with the first and second conductive films CTF1 and CTF2. For example, an inner space of the first and second contact holes CNT1 and CNT2 surrounded by the first and second conductive films CTF1 and CTF2 may be filled with the second conductive patterns CP2.

Thereafter, the second conductive patterns CP2 may be patterned using a mask to form the first sensor electrodes TE11 and TE12 and the second bridge pattern BRP2 from the second conductive patterns CP2. For example, in an embodiment a photoresist film exposing an area other than an area in which the first sensor electrodes TE11 and TE12 and the second bridge pattern BRP2 are to be formed may be formed on the touch insulating layer TS_INS. In an embodiment, the photoresist film may be patterned by performing exposure and development processes through a mask. After the first sensor electrodes TE11 and TE12 and the second bridge pattern BRP2 are formed, the photoresist film formed on the touch insulating layer TS_INS may be removed.

Accordingly, the first sensor electrode TE11 connected to (e.g., electrically connected thereto) the first bridge pattern BRP11 through the first contact hole CNT1 may be provided. In addition, the first sensor electrode TE12 connected to (e.g., electrically connected thereto) the first bridge pattern BRP11 through the second contact hole CNT2 may be provided. The first sensor electrode TE11 may be electrically connected to the first conductive pattern CP1 through the first conductive film CTF1 of the first contact hole CNT1. The second sensor electrode TE12 may be electrically connected to the first conductive pattern CP1 through the second conductive film CTF2 of the second contact hole CNT2.

Figure 16:
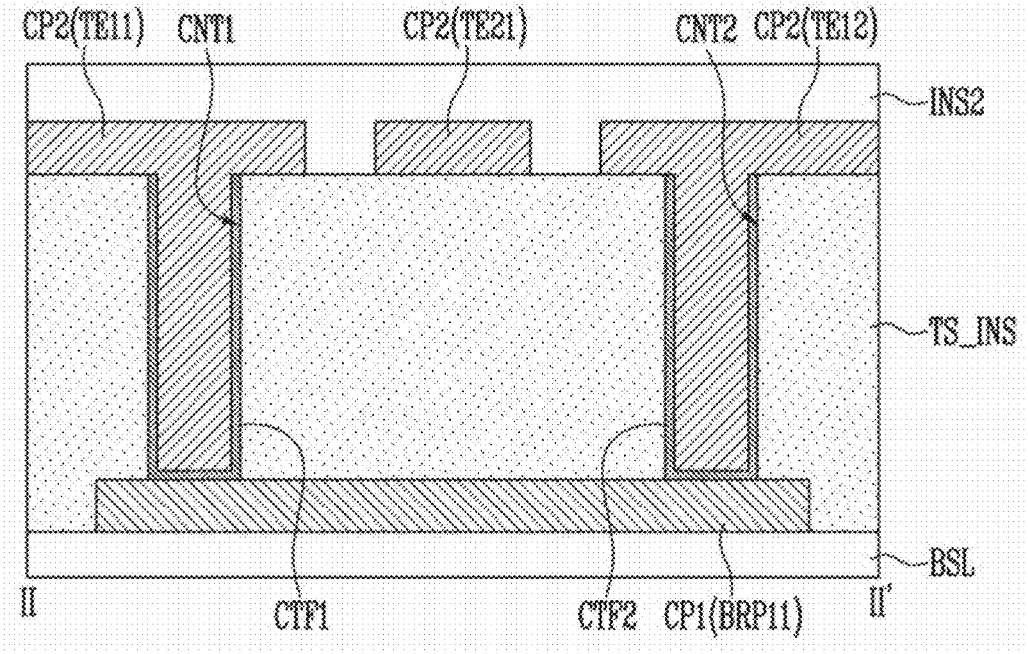

Referring to FIG. 16, the touch insulating layer TS_INS and the second insulating layer INS2 covering the second conductive patterns CP2 may be formed. In an embodiment, the second insulating layer INS2 may be formed on (e.g., formed directly thereon) the touch insulating layer TS_INS to be in direct contact with the first sensor electrodes TE11 and TE12 and the second bridge pattern BRP2.

The touch sensor according to embodiments of the present disclosure may form conductive films including a conductive material having high step coverage and low conductivity through chemical vapor deposition in the contact holes of the touch insulating layer. Accordingly, the touch sensor according to embodiments of the present disclosure may provide a stable electrical connection and increase reliability by more effectively reducing contact defects between the first conductive pattern and the second conductive patterns electrically connected through the contact holes.

Although certain non-limiting embodiments and implementations have been described herein, other embodiments and modifications will be apparent from this description. Accordingly, the present disclosure is not limited to the described embodiments, and includes various modifications and equivalent arrangements.

What is claimed is:

1. A display device comprising:
a substrate;
pixels disposed on the substrate;
a base layer disposed on the pixels;
a first conductive pattern disposed on the base layer;
a touch insulating layer disposed on the base layer, the touch insulating layer including contact holes defined therein, the contact holes overlap portions of the first conductive pattern and exposing the portions of the first conductive pattern;
second conductive patterns disposed on the touch insulating layer; and
conductive films disposed within the contact holes and contacting the exposed portions of the first conductive pattern, the conductive films are comprised of a different material than the second conductive patterns,
wherein a first portion of the second conductive patterns are disposed in the contact holes and are electrically connected to the first conductive pattern through the conductive films.

2. The display device of claim 1, wherein:
the contact holes penetrate the touch insulating layer between the first conductive pattern and a first-second conductive pattern of the second conductive patterns, and between the first conductive pattern and a second-second conductive pattern of the second conductive patterns.

3. The display device of claim 1, wherein:
the conductive films include a conductive material formed through a chemical vapor deposition process.

4. The display device of claim 1, wherein:
the first portion of the second conductive patterns are spaced apart from the first conductive pattern and the touch insulating layer with the conductive films interposed therebetween.

5. The display device of claim 1, wherein:
the conductive films cover inner surfaces of the contact holes.

6. The display device of claim 1, wherein
each of the conductive films directly contacts a first conductive pattern of the first conductive patterns and a second conductive pattern of the second conductive patterns.

7. The display device of claim 1, wherein:
each of the second conductive patterns includes:
a (2-1)-th conductive pattern disposed directly on the touch insulating layer; and
a (2-2)-th conductive pattern disposed inside one of the contact holes and directly connected to the (2-1)-th conductive pattern, the (2-2)-th conductive pattern is the first portion of the second conductive patterns.

8. The display device of claim 7, wherein: the (2-2)-th conductive pattern is surrounded by the conductive films except for a first surface directly connected to the (2-1)-th conductive pattern.

9. The display device of claim 1, wherein: the contact holes have an aspect ratio greater than or equal to 1.

10. The display device of claim 1, wherein: the touch insulating layer includes an organic insulating material.

11. The display device of claim 1, wherein: a thin film encapsulation layer is disposed on the pixels, the thin film encapsulation layer including at least one organic film and at least one inorganic film, wherein the base layer is disposed on the thin film encapsulation layer.

12. The display device of claim 1, wherein: a thin film encapsulation layer is disposed on the pixels, the thin film encapsulation layer including at least one organic film and at least one inorganic film, wherein the base layer comprises an uppermost layer of the thin film encapsulation layer.

13. A manufacturing method of a display device, comprising:

providing a substrate;

forming pixels on the substrate;

providing a base layer on the pixels;

forming a first conductive pattern on the base layer;

forming a touch insulating layer, the touch insulating layer including contact holes overlapping portions of the first conductive pattern on the base layer, the contact holes exposing the portions of the first conductive pattern;

forming conductive films within the contact holes and contacting the exposed portions of the first conductive pattern; and forming second conductive patterns on the touch insulating layer, wherein the second conductive patterns and the conductive films are comprised of a different material from each other, wherein a first portion of the second conductive patterns are disposed in the contact holes and are formed to be electrically connected to the first conductive pattern through the conductive films.

14. The manufacturing method of the display device of claim 13, wherein: the conductive films include a conductive material formed through a chemical vapor deposition process.

15. The manufacturing method of the display device of claim 13, wherein: the conductive films cover inner surfaces of the contact holes.

16. The manufacturing method of the display device of claim 13, wherein: each of the conductive films directly contact a first conductive pattern of the first conductive patterns and a second conductive pattern of the second conductive patterns.

17. The manufacturing method of the display device of claim 13, wherein: the contact holes have an aspect ratio greater than or equal to 1.

18. The manufacturing method of claim 13, further comprising:

forming a thin film encapsulation layer on the pixels, the thin film encapsulation layer including at least one organic film and at least one inorganic film.

19. The manufacturing method of claim 18, wherein the base layer is disposed on the thin film encapsulation layer or is an uppermost layer of the thin film encapsulation layer.

20. An electronic device, comprising:

a display device comprising:

a substrate;

pixels disposed on the substrate;

a base layer disposed on the pixels, a first conductive pattern disposed on the base layer;

a touch insulating layer disposed on the base layer, the touch insulating layer including contact holes defined therein, the contact holes overlap portions of the first conductive pattern and exposing the portions of the first conductive pattern;

second conductive patterns disposed on the touch insulating layer, and conductive films disposed within the contact holes and contacting the exposed portions of the first conductive pattern, the conductive films are comprised of a different material than the second conductive patterns, wherein a first portion of the second conductive patterns are disposed in the contact holes and are electrically connected to the first conductive pattern through the conductive films.

* * * * *